LOGICAL CIRCUIT COMPRISING FIELD-EFFECT TRANSISTORS

Filed Dec. 21, 1965

Inventor
A. TOMOZAWA-
H. SHIBA
By Walter J. Baum
Attorney

United States Patent Office 3,471,712

Patented Oct. 7, 1969

3,471,712

LOGICAL CIRCUIT COMPRISING FIELD-EFFECT TRANSISTORS

Atsusi Tomozawa and Hiroshi Shiba, Tokyo, Japan, assignors to Nippon Electric Company, Limited, Tokyo, Japan, a corporation of Japan Filed Dec. 21, 1965, Ser. No. 515,387

Claims priority, application Japan, Dec. 28, 1964, 39/74,360

Int. Cl. H03k *19/08*

U.S. Cl. 307—205 2 Claims

ABSTRACT OF THE DISCLOSURE

A semiconductor logic circuit is described. The circuit employs a pair of field-effect transistors each of which is in series connection with a non-linear constant voltage load element. The non-linear element is connected between the drain terminals of the field-effect transistors and a direct current potential source. The application of signals to gate terminals of the transistors at values greater or lower than a predetermined critical value will initiate operation of the circuit as a logic element.

This invention relates to a logical circuit comprising field-effect transistors, or FET's, and more specifically to solid state logical circuits which are composed of a semiconductor crystal to which various elements are attached.

An FET, which is often called a unipolar transistor, is a circuit element (as disclosed by W. Shockley in "Proceedings of the IRE," vol. 40, pp. 1365–1376, November 1952), wherein the voltage-versus-current characteristic between the grounded source terminal in general and the drain terminal (usually supplied through a load with positive electric potential) is controllable by the control electric potential applied to the gate terminal. The FET requires very small control power, because its input impedance is of the order of 1 megohm, and has excellent high-frequency characteristics. FET's of various types are presently known among which an FET of the N type (as now termed) is the one revealed by Shockley and an FET of the P type is the one in which the drain terminal is supplied with negative electric potential. From another standpoint, FET's are classified into those of the depression-mode type and those of the induced-channel type. An FET of the I type, as called herein, is an FET of the N or the P induced-channel type, whose characteristics are such that no appreciable drain current $I_D$ flows so long as the gate voltage $V_G$ is lower than a critical voltage $V_t$ of the same polarity as the drain voltage $V_D$ (which is positive) and that the drain current suddenly increases as the gate voltage $V_G$ exceeds the critical voltage $V_t$.

Known logical circuits comprising FET's have been defective in that the output voltage lacks uniformity because of the discrepancy in the mutual conductances or other characteristics of the respective FET's. Furthermore, such a logical circuit, when made on a semiconductor crystal in the form of a solid circuit, has poor temperature characteristics because a resistor formed by utilizing the characteristics of the semiconductor proper is then used as the load resistor.

An object of the present invention is therefore to provide a logical circuit employing FET's, wherein the requirements for the characteristics of the FET's are not severe.

Another object of this invention is to provide a logical circuit of the kind, which can be used even when a plurality of such logical circuit is necessary between any two successive stages for adapting the level of the preceding-tage output signal to the level of the succeeding-stage input signal.

Still another object of this invention is to make it possible to provide, in the form of the solid circuit, a logical circuit of the kind having excellent temperature characteristics.

According to this invention, there is provided a logical circuit employing FET's of the I type wherein use is made of a Zener diode or a similar non-linear element of the constant-voltage type, the voltage difference across which assumes a substantially constant characteristic voltage when the current flowing therethrough exceeds a certain critical current, and wherein the critical current is so selected that it will not be smaller than that drain current of said FET's which flows at the critical voltage of any of said FET's.

With the logical circuit of this invention, the output voltage obtained when the FET's are conductive is substantially determined by the non-linear characteristics of the constant-voltage-type non-linear element so that the discrepancy in the characteristics of the FET's matters little. Also, it becomes possible with this invention to provide a multi-stage logical circuit without a level-shift circuit between successive stages by using the gate and the drain voltages as the input and the output voltages, respectively, because the drain voltage of an I-type FET may assume any value smaller than or larger than (and of the same polarity) as the critical votlage. Furthermore, the fact that it is possible for constant-voltage-type non-linear circuits to be provided, even though formed in the form of solid circuits, with considerably uniform characteristics and with excellent temperature characteristics, makes it feasible to manufacture the logical circuits of the invention in the form of solid circuits with excellent temperature characteristics and (because the requirements for the characteristics of FET's are not severe with this invention) with high yield.

The above-mentioned and other features and objects of this invention and the means for attaining them will become more apparent and the invention itself will be best understood by reference to the following description of embodiments of the invention taken in conjuction with the accompanying drawings in which.

Figures 1, 2, 3, 4:
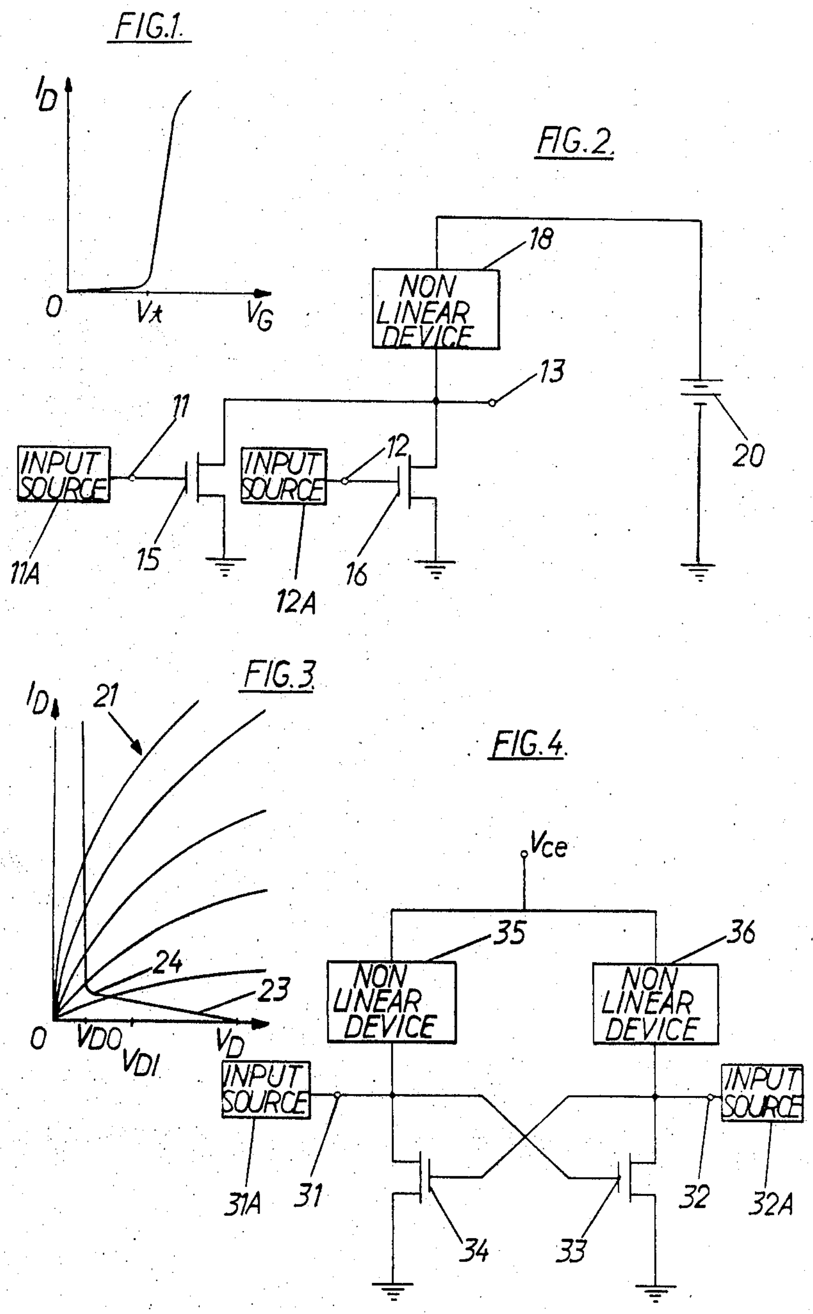
FIG. 1 shows an example of the input-output characteristics of field-effect transistors.
FIG. 2 is a circuit diagram of a NOR circuit of the present invention.
FIG. 3 shows the characteristics of the circuit of FIG. 2.
FIG. 4 is a circuit diagram of a flipflop circuit wherein this invention is put to practice.

Referring to FIG. 1 wherein the abscissa axis indicates the gate voltage $V_G$ and the ordinate axis indicates the drain current $I_D$. As seen in FIG. 1, the drain current $I_D$ of an FET of the I type is substantially zero while the gate voltage $V_G$ is smaller than the critical voltage $V_t$ and rapidly increases with an increase in the gate voltage $V_G$ above the critical voltage $V_t$.

Referring to FIG. 2, a two-input NOR circuit of this invention is illustrated. The NOR gate includes a first and second input terminal 11 and 12; respectively connected to input signal sources 11A and 12A; and an output terminal 13. A first and a second I-type FET 15 and 16 are provided and connected so that the source terminals thereof are grounded as illustrated. The drain terminals of the FET's are both connected to the output terminal 13, and the gate terminals of the FET's are connected to the first and the second input terminals 11 and 12, respectively. A Zener diode or a similar non-linear element of the constant voltage type 18 is connected at one end thereof to the output terminal 13. A D.C. source is connected between the other end of the constant-voltage-type non-linear element 18 and ground, and supplies electric current to both the first and the second FET's 15 and 16 through the constant-voltage-type non-linear element 18.

Referring to FIG. 3 the abscissa axis indicates the drain voltage $V_D$ of the FET 15 or 16 which is equal to the voltage of the output terminal 13 and wherein the ordinate axis illustrates the drain current $I_D$ of the FET 15 or 16 in question. The relation between the drain voltage $V_D$ and the drain current $I_D$ of the I-type FET 15 or 16 are illustrated by a group of $V_D$–$I_D$ curves 21 with the gate voltage $V_G$ as the parameter. The curve 23 represents the load curve for the case where the load resistor for the FET 15 or 16 is the constant-voltage-type non-linear element 18. When the input voltages supplied to the input terminals 11 and 12, respectively, are smaller than the critical voltages $V_t$ of the FET's 15 and 16, the drain currents $I_D$ are substantially zero. This means that the voltage $V_{DI}$ of the output terminal 13 is then equal to the D.C. electromotive force $V_{CC}$ of the D.C. source 20. When either of the input voltages rises above the critical voltage $V_t$, the drain current $I_D$ flows in the corresponding one of the FET's 15 and 16 through the constant-voltage-type non-linear element 18. This shifts the working point of the circuit comprising the corresponding FET 15 or 16 to the intersection of the load curve 23 and that one of the $V_D$–$I_D$ curve 21 which is determined by the gate voltage $V_G$. If the drain current $I_D$ given by the ordinate axis of the intersection is greater than the electric current corresponding to a point of deflection 24 of the load curve 23, the voltage $V_{DO}$ of the output terminal 13 is equal to the difference obtained by subtracting the characteristic voltage $V_Z$ of the constant-voltage-type non-linear element 18 from the D.C. electromotive force $V_{CC}$ of the D.C. source 20. In order to consider the case where both of the input voltages are greater than the critical voltages $V_t$, let it be assumed that the ordinate axis of FIG. 3 indicates the drain current flowing through one of the FET's 15 or 16 (although there may be some discrepancies in the $V_D$–$I_D$ curves of the FET's 15 and 16). In this case, the voltage of the output terminal 13 is equal to the above-mentioned voltage $V_{DO}$, provided however that each of the drain currents flowing through the FET's 15 and 16, respectively, is larger than the electric current corresponding to the deflection point 24. The circuit shown in FIG. 2, thus operates as a NOR gate with the input voltages which are smaller and larger than the critical voltage $V_t$, respectively, the electromotive force $V_{CC}$ of the D.C. source 20, and the above-mentioned voltage $V_{DO}$ presumed to represent binary "0," "1," "1," and "0," respectively.

For the NOR circuit of this invention, it will now be clear that the two types of output voltages $V_{DI}$ and $V_{DO}$ are of the same polarity as the critical voltage $V_t$ of the I-type FET and that it is easy to make these output voltages $V_{DI}$ and $V_{DO}$ greater and smaller than the critical voltage $V_t$ of the I-type FET, respectively. This makes it possible to use a plurality of NOR circuits of this invention connected in stages without any level-shift circuits between the successive stages.

Referring to FIG. 4, a flipflop circuit is illustrated which is assembled according to this invention. This flipflop circuit includes: a first and a second input terminal 31 and 32 which are respectively connected to input sources 31A and 32A; a first I-type FET 33 whose source terminal is grounded and whose gate and drain terminals are connected to the first and the second terminals 31 and 32 respectively. A second FET 34 is provided and connected so that the source terminal thereof is grounded and the gate and drain terminals are connected to the second and the first terminals 32 and 31, respectively. Constant-voltage-type non-linear elements 35 and 36 are provided and connected between a D.C. source of the electromotive force $V_{CC}$ and the first and the second terminals 31 and 32. It will be apparent that the circuit performs the flipflop operation.

While only a two-input NOR circuit and a flipflop circuit have been illustrated above as the embodiments of the present invention, it will be obvious to those skilled in the art to design other logical circuits without departing from the spirit of this invention.

While we have described above the principles of our invention in connection with specific embodiments, it is to be clearly understood that this description is made only by way of example, and not as a limitation to the scope of our invention as set forth in the objects thereof and in the accompanying claims.

What is claimed is:

1. In a logic circuit, the combination comprising at least a first and a second field effect transistor, each having a drain, a source, and an input gate terminal, said transistors each being of the type wherein substantially no drain current flows therefrom until the gate input potential exceeds a predetermined critical value of the same polarity as the potential at the drain terminal thereof, said drain current increasing rapidly with increases of said gate input potential above said critical value; a direct potential source; and at least one constant voltage type non-linear load element connected between the drain terminals of said transistors and said direct potential source, and means for supplying signals to the gate terminals of said transistors that can have values greater and less than said critical value and wherein an output terminal is connected to the drain terminals of both said transistors, whereby said logic circuit will function as a NOR gate.

2. In a logic circuit, the combination comprising at least a first and a second field effect transistor, each having a drain, a source and an input gate terminal, said transistors each being of the type wherein substantially no drain current flows therefrom until the gate input potential exceeds a predetermined critical value of the same polarity as the potential at the drain terminal thereof, said drain current increasing rapidly with increases of said gate input potential above said critical value, a direct potential source and a constant voltage type non-linear load element connected between the drain terminal of each transistor and said direct potential source and wherein the gate terminal of one transistor is coupled to a point between the non-linear device connected to the drain of the other transistor.

References Cited

UNITED STATES PATENTS

| | | | |
|---|---|---|---|
| 3,134,912 | 5/1964 | Evans | 307—279 |
| 3,299,291 | 1/1967 | Warner et al. | 307—205 X |
| 3,309,610 | 3/1967 | Yamamoto | 317—235 X |

DONALD D. FORRER, Primary Examiner

U.S. Cl. X.R.

307—215, 279